US012733336B2

(12) United States Patent
Adachi et al.

(10) Patent No.: US 12,733,336 B2
(45) Date of Patent: Sep. 8, 2026

(54) METHOD FOR PRODUCING LIGHT EMITTING ELEMENT, AND LIGHT EMITTING ELEMENT

(71) Applicant: SHARP KABUSHIKI KAISHA, Sakai City (JP)

(72) Inventors: Takahiro Adachi, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 562 days.

(21) Appl. No.: 18/278,817

(22) PCT Filed: Apr. 13, 2021

(86) PCT No.: PCT/JP2021/015254

§ 371 (c)(1),
(2) Date: Aug. 24, 2023

(87) PCT Pub. No.: WO2022/219697

PCT Pub. Date: Oct. 20, 2022

(65) Prior Publication Data

US 2024/0196719 A1 Jun. 13, 2024

(51) Int. Cl.

| | |
|---|---|
| ***H10K 59/12*** | (2023.01) |
| ***H10K 71/00*** | (2023.01) |
| ***H10K 71/20*** | (2023.01) |
| *H10K 59/35* | (2023.01) |

(52) U.S. Cl.

CPC ......... *H10K 59/1201* (2023.02); *H10K 71/00* (2023.02); *H10K 71/211* (2023.02); *H10K 59/35* (2023.02)

(58) Field of Classification Search

CPC ... H10K 59/1201; H10K 71/00; H10K 71/211

USPC .......................................................... 257/79

See application file for complete search history.

(56) References Cited

U.S. PATENT DOCUMENTS

| | | | | |
|---|---|---|---|---|
| 2013/0057142 A1* | 3/2013 | Kimura | .................. | H10K 59/35 313/504 |
| 2021/0126216 A1* | 4/2021 | Umeda | ................ | H10K 50/115 |
| 2022/0336556 A1* | 10/2022 | Wang | .................. | H10K 59/124 |

FOREIGN PATENT DOCUMENTS

| | | |
|---|---|---|
| JP | 2013-065830 A | 4/2013 |
| WO | 2019186847 A1 | 10/2019 |

* cited by examiner

*Primary Examiner* — Xia L Cross

(74) *Attorney, Agent, or Firm* — ScienBiziP, P.C.

(57) ABSTRACT

A method for manufacturing a light-emitting element includes a) forming an intermediate layer containing a first resin on a charge transport layer, b) forming a light-emitting layer containing a second resin, a second photosensitive material, and a first luminescent material on the intermediate layer, c) exposing the intermediate layer and the light-emitting layer in a predetermined pattern to obtain an exposed intermediate layer and an exposed light-emitting layer, respectively, and d) developing the exposed intermediate layer and the exposed light-emitting layer with a developing solution. A solubility of a second portion of the exposed intermediate layer dissolved in the developing solution and a solubility of a first portion of the exposed light-emitting layer dissolved in the developing solution are different from each other.

20 Claims, 6 Drawing Sheets

METHOD FOR PRODUCING LIGHT EMITTING ELEMENT, AND LIGHT EMITTING ELEMENT

TECHNICAL FIELD

The disclosure relates to a method for manufacturing a light-emitting element and a light-emitting element.

BACKGROUND ART

For example, JP 2013-65830 A discloses a technique in which an intermediate layer made of a water-soluble polymer and a resist layer are layered on an organic compound layer including a light-emitting layer, and the resist layer is exposed and developed.

SUMMARY

Technical Problem

However, the intermediate layer in JP 2013-65830 A is intended to protect the organic compound layer below the intermediate layer from a developing solution when the resist layer is developed, and is not formed below the light-emitting layer included in the organic compound layer.

A main object of the disclosure is to provide a method for manufacturing a light-emitting element capable of reducing damage to a layer below a light-emitting layer, for example, a charge transport layer, when forming the light-emitting layer patterned using a photosensitive material containing a light-emitting material.

Solution to Problem

A method for manufacturing a light-emitting element of an embodiment of the disclosure includes a) forming an intermediate layer containing a first resin on a charge transport layer, b) forming a light-emitting layer containing a second resin, a second photosensitive material, and a first luminescent material on the intermediate layer, c) exposing the intermediate layer and the light-emitting layer in a predetermined pattern to obtain an exposed intermediate layer and an exposed light-emitting layer, respectively, and d) developing the exposed intermediate layer and the exposed light-emitting layer with a developing solution, in which a solubility of a second portion of the exposed intermediate layer dissolved in the developing solution and a solubility of a first portion of the exposed light-emitting layer dissolved in the developing solution are different from each other.

A method for manufacturing a light-emitting element of another embodiment of the disclosure includes a) forming an intermediate layer containing a water-soluble resin on a charge transport layer, b) forming a light-emitting layer containing a hydrophobic resin, a second photosensitive material, and a first luminescent material on the intermediate layer, c) exposing the intermediate layer and the light-emitting layer in a predetermined pattern to obtain an exposed intermediate layer and an exposed light-emitting layer, and d) developing the exposed intermediate layer and the exposed light-emitting layer with a developing solution.

A light-emitting element of an embodiment of the disclosure includes a charge transport layer, an intermediate layer provided on the charge transport layer and containing a first photosensitive material or a modified product of the first photosensitive material, and a light-emitting layer provided on the intermediate layer and containing a second photosensitive material or a modified product of the second photosensitive material and a first luminescent material.

DESCRIPTION OF EMBODIMENTS

An example of preferable embodiments for carrying out the disclosure will be described hereinafter. However, the following embodiment is merely illustrative. The disclosure is not limited in any way to the following embodiment.

First Embodiment

Figure 1:
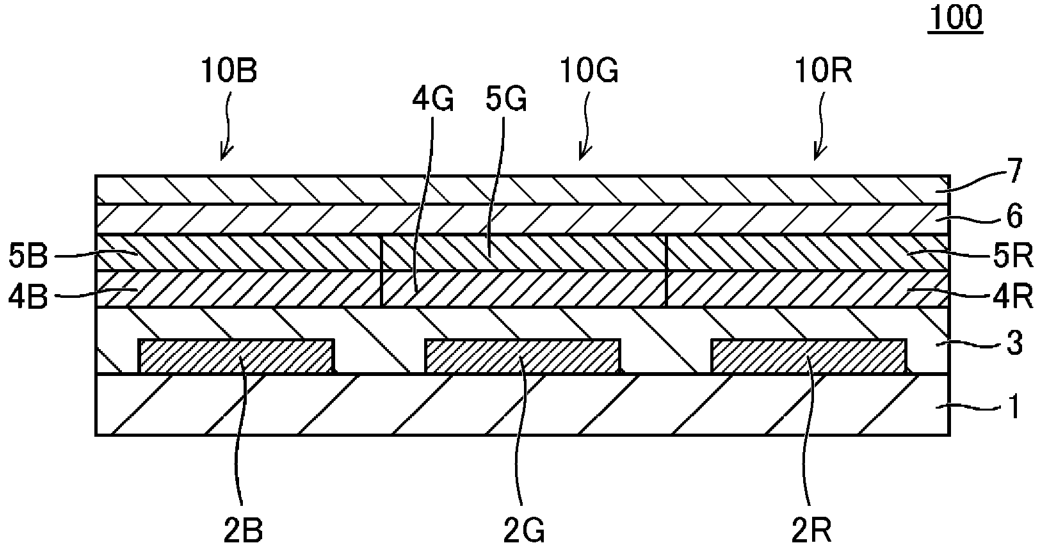
FIG. 1 is a view schematically illustrating an example of a layered structure of a light-emitting element according to a first embodiment.

FIG. 1 is a view schematically illustrating an example of a layered structure of a light-emitting element 100 according to the present embodiment.

The light-emitting element 100 is a device that emits light. The light-emitting element 100 may be, for example, an illumination device (e.g., a backlight) that emits light such as white light, or may be a display device that displays an image (including, for example, character information) by emitting light. In the present embodiment, an example in which the light-emitting element 100 is one pixel in a display device will be described. A display device can be formed, for example, by arranging a plurality of pixels in a matrix shape.

The light-emitting element 100 includes, for example, a first light-emitting element 10R that emits red light, a second light-emitting element 10G that emits green light, and a third light-emitting element 10B that emits blue light as illustrated in FIG. 1. The first light-emitting element 10R has a light emission central wavelength at a first wavelength and emits light at, for example, approximately 630 nm. The second light-emitting element 10G has a light emission central wavelength at a second wavelength shorter than the first wavelength and emits light at, for example, approximately 530 nm. The third light-emitting element 10B has a light emission central wavelength at a third wavelength shorter than the second wavelength and emits light at, for example, approximately 440 nm.

The first light-emitting element 10R has a structure in which a first electrode 2R, a first charge transport layer 3, an intermediate layer 4R, a first light-emitting layer 5R, a second charge transport layer 6, and a second electrode 7 are layered on a substrate 1 in this order.

The substrate 1 is made of, for example, glass, and functions as a support body that supports each of the layers described above. The substrate 1 may be, for example, an array substrate on which a thin film transistor (TFT) and the like are formed.

The first electrode 2R is disposed on the substrate 1. The first electrode 2R supplies, for example, a first charge to the first light-emitting layer 5R.

The first charge transport layer 3 is disposed on the first electrode 2R. The first charge transport layer 3 transports the first charge injected from the first electrode 2R to the first light-emitting layer 5R. Further, the first charge transport layer 3 may be composed of a single layer or multiple layers.

The intermediate layer 4R is disposed on the first charge transport layer 3. The intermediate layer 4R contains a first photosensitive material or a modified product of the first photosensitive material. To be more specific, the intermediate layer 4R is disposed on the first electrode 2R and the first charge transport layer 3.

The intermediate layer 4R preferably has a thickness of 1 nm and more and 50 nm or less, for example. In addition, the upper limit of the thickness of the intermediate layer 4R is more preferably 40 nm or less, still more preferably 30 nm or less, and yet still more preferably 20 nm or less for the purpose of curbing an increase in drive voltage. With the above-described thickness, deterioration in performance such as an increase in drive voltage of the light-emitting element can be suppressed, and carrier balance can be adjusted. The intermediate layer 4R may contain a functional material such as a first light-emitting material or a second charge transport material that transports a second charge, for example. When the intermediate layer 4R contains the first light-emitting material, for example, the intermediate layer 4R functions as a part of the first light-emitting layer 5R. In addition, when the intermediate layer 4R contains the first charge transport material, for example, the intermediate layer 4R functions as a part of the first charge transport layer 3. In particular, when the intermediate layer 4R contains neither the first light-emitting material nor the first charge transport material, the intermediate layer 4R preferably has a thickness of 5 nm or more and 30 nm or less to transport the first charge from the first electrode 2R to the first light-emitting layer 5R via the first charge transport layer 3. The intermediate layer 4R is preferably in direct contact with the first charge transport layer 3 and the first light-emitting layer to be described later.

The intermediate layer 4R is formed, for example, by exposing and developing the intermediate layer 4 formed by applying a first photosensitive resin composition containing a first resin and a first photosensitive material onto the first charge transport layer 3 to pattern the intermediate layer 4. Thus, the intermediate layer 4R contains the first photosensitive material or the modified product of the first photosensitive material. The first photosensitive resin composition may be a positive photosensitive resin composition or a negative photosensitive resin composition. Note that by using the first photosensitive material, the dimensional accuracy of the intermediate layer 4R is improved.

Examples of the modified product of the first photosensitive material include a polymerization product having a crosslinked structure in which a decomposed product of a photopolymerization initiator, and a residual group of a cross-linkable group in a resin including the cross-linkable group and/or the cross-linkable group in the resin including the cross-linkable group, are crosslinked when the first photosensitive resin composition is negative-working, and include a decomposed product of the first photosensitive material when the first photosensitive resin composition is positive-working.

The first light-emitting layer 5R is disposed on the intermediate layer 4R. The first light-emitting layer 5R has a light emission central wavelength at the first wavelength and emits light at, for example, approximately 630 nm. For example, the first light-emitting layer 5R contains a first light-emitting material that has a light emission central wavelength at the first wavelength and that emits light at, for example, approximately 630 nm. The first light-emitting layer 5R preferably has a thickness of 1 nm or more and 100 nm or less.

The second charge transport layer 6 is disposed on the first light-emitting layer 5R. The second charge transport layer 6 transports the second charge injected from the second electrode 7 to the first light-emitting layer 5R. The second charge has polarity opposite to that of the first charge. Further, the second charge transport layer 6 may be composed of a single layer or multiple layers.

The second electrode 7 is disposed on the second charge transport layer 6. The second electrode 7 supplies, for example, the second charge to the first light-emitting layer 5R.

The first electrode 2R and the second electrode 7 are made of a conductive material such as, for example, a metal or a transparent conductive oxide. Examples of the metal described above include Al, Cu, Au, and Ag. Examples of the transparent conductive oxide described above include indium tin oxide (ITO), indium zinc oxide (IZO), zinc oxide (ZnO), aluminum zinc oxide (ZnO:Al (AZO)), and boron zinc oxide (ZnO:B (BZO)). Further, the first electrode 2R and the second electrode 7 may be, for example, a layered body including at least one metal layer and/or at least one transparent conductive oxide layer.

One of the first electrode 2R and the second electrode 7 is made of a light-transmissive material. Further, one of the first electrode 2R and the second electrode 7 may be formed of a light-reflective material. When the light-emitting element 100 is a top emission light-emitting element, for example, the second electrode 7, which is an upper layer, is formed of a light-transmissive material, and the first electrode 2R, which is a lower layer, is formed of a light-reflective material. In addition, when the light-emitting element 100 is a bottom emission light-emitting element, for example, the second electrode 7, which is an upper layer, is formed of a light-reflective material, and the first electrode 2R, which is a lower layer, is formed of a light-transmissive material. Furthermore, one of the first electrode 2R and the second electrode 7 may be an electrode with light reflectivity as a layered body made of a light-transmissive material and a light-reflective material.

A transparent conductive material can be used as a light-transmissive material, for example. Specifically, for example, indium tin oxide (ITO), indium zinc oxide (IZO), tin oxide ($SnO_2$), or fluorine-doped tin oxide (FTO) can be used as a light-transmissive material. Since these materials have a high transmittance with respect to visible light, luminous efficiency of the light-emitting element 100 is improved.

A metal material can be used as a light-reflective material, for example. Specifically, for example, aluminum (Al), silver (Ag), copper (Cu), or gold (Au) can be used as a light-reflective material. Since these materials have a high reflectivity with respect to visible light, luminous efficiency is improved.

Examples of the first light-emitting material include quantum dots. For example, quantum dots are semiconductor fine particles having a particle size equal to or less than 100 nm, and can include a group II-VI semiconductor compound such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe, and/or a crystal of a group III-V semiconductor compound such as GaAs, GaP, InN, InAs, InP, and InSb, and/or a crystal of a group IV semiconductor compound such as Si and Ge. Furthermore, quantum dots may have, for example, a core-shell structure in which such a semiconductor crystal described above is a core and a shell material having a high band gap is coated over the core.

Each of the first charge transport layer 3R and the second charge transport layer 6 may be a hole transport layer or an electron transport layer. For example, when the first electrode 2R is the anode electrode and the second electrode 7 is the cathode electrode, the first charges are positive holes, the second charges are electrons, the first charge transport layer 3R is a hole transport layer, and the second charge transport layer 6 is an electron transport layer. For example, when the first electrode 2R is the cathode electrode and the second electrode 7 is the anode electrode, the first charges are electrons, the second charges are positive holes, the first charge transport layer 3R is an electron transport layer, and the second charge transport layer 6 is a hole transport layer. For example, the hole transport layer and the electron transport layer may be single-layered or multilayered. When the hole transport layer is multilayered, an example thereof is a layered structure including a layer with a hole injection ability on the most anode electrode side. In addition, when the electron transport layer is multilayered, an example thereof is a layered structure including a layer with an electron injection ability on the most cathode electrode side.

Examples of a material forming the hole transport layer include materials containing one or more types selected from the group consisting of oxides, nitrides, or carbides containing at least one of Zn, Cr. Ni, Ti, Nb, Al, Si, Mg, Ta, Hf, Zr, Y, La, and Sr; materials such as 4,4',4"-tris(9-carbazoyl)triphenylamine (TCTA), 4,4'-bis[N-(1-naphthyl)-N-phenyl-amino]-biphenyl (NPB), zincphthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), and $MoO_3$; and hole transport organic materials such as poly(N-vinylcarbazole) (PVK), poly(2,7-(9,9-di-n-octylfluorene)-(1,4-phenylene-((4-sec-butylphenyl)imino)-1,4-phenylene (TFB), a poly(triphenylamine) derivative (Poly-TPD), and poly(3,4-ethylenedioxythiophene)/poly(4-styrenesulfonate) (PEDOT-PSS). Only one type of these hole transport materials may be used, or two or more types thereof may be appropriately mixed and used.

As materials forming the electron transport layer, electron transport materials, for example, zinc oxide (e.g., ZnO), titanium oxide (e.g., $TIO_2$), and strontium oxide titanium (e.g., $SrTiO_3$) may be used. Only one type of these electron transport materials may be used, or two or more types thereof may be appropriately mixed and used.

The materials forming the hole transport layer and the electron transport layer are selected as appropriate according to the configuration and characteristics of the light-emitting element 100.

Next, the second light-emitting element 10G will be described.

The second light-emitting element 10G has a configuration similar to that of the first light-emitting element 10R. However, they are different in that the intermediate layer 4R is changed to an intermediate layer 4G and the first light-emitting layer 5R is changed to a second light-emitting layer 5G.

The intermediate layer 4G is the same as the intermediate layer 4R.

The second light-emitting layer 5G has a light emission central wavelength at the second wavelength and emits light at, for example, approximately 530 nm. The second light-emitting layer 5G contains a second light-emitting material that has a light emission central wavelength at the second wavelength and that emits light at, for example, approximately 530 nm.

Examples of the second light-emitting material include quantum dots. The quantum dots are similar to those of the first light-emitting material, but have a light emission central wavelength at the second wavelength.

Next, a third light-emitting element 10B will be described.

The third light-emitting element 10B has a configuration similar to that of the first light-emitting element 10R. However, they are different in that the intermediate layer 4R is changed to an intermediate layer 4B and the first light-emitting layer 5R is changed to a third light-emitting layer 5B.

The intermediate layer 4B is the same as the intermediate layer 4R.

The third light-emitting layer 5B has a light emission central wavelength at the third wavelength and emits light at, for example, approximately 440 nm. For example, the third light-emitting layer 5B includes a third light-emitting material that has a light emission central wavelength being the third wavelength and emits light at, for example, approximately 440 nm.

Examples of the third light-emitting material include quantum dots. The quantum dots are similar to those of the first light-emitting material, but have a light emission central wavelength at the third wavelength.

Furthermore, in the light-emitting element 100, a bank may be provided isolating the light-emitting elements of the respective colors from each other. The bank is formed of, for example, resin having insulating properties such as polyimide and acrylic resins.

Further, in the light-emitting element 100, the first charge transport layer 3, the second charge transport layer 6, and the second electrode 7 are formed as common layers. However, this does not have to be the case, and the first charge transport layer 3, the second charge transport layer 6, and the second electrode 7 may be divided to be separate for each light-emitting element of the respective colors.

Next, an example of a method for manufacturing the light-emitting element 100 according to the present embodiment will be described with reference to FIGS. 1 and 2A to 2E.

Figure 2A:
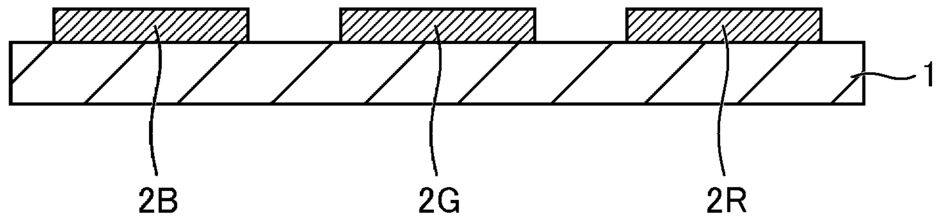
FIG. 2A is a view for describing a step in an example of a method for manufacturing a light-emitting element according to the first embodiment.

First, the first electrodes 2R, 2G, and 2B are formed on the substrate 1 as illustrated in FIG. 2A (S1). The first electrodes 2R, 2G, and 2B can be formed using any of various known methods, for example, a sputtering method or a vacuum vapor deposition technique.

Figure 2B:
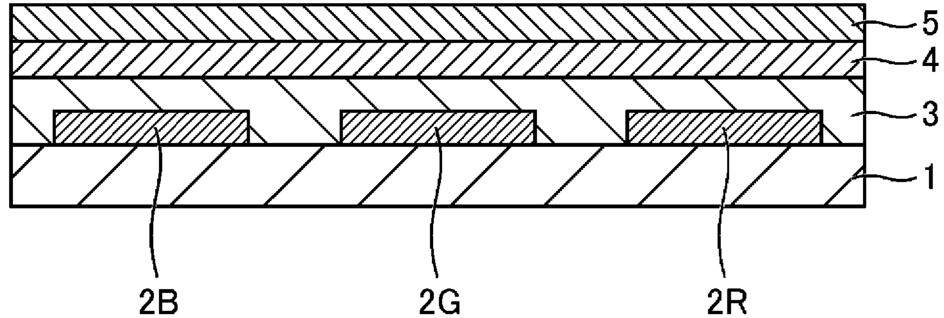
FIG. 2B is a view for describing a step in the example of the method for manufacturing the light-emitting element according to the first embodiment.

Next, the first charge transport layer 3 is formed on the first electrodes 2R, 2G, and 2B as illustrated in FIG. 2B (S2). Further, the intermediate layer 4 and the light-emitting layer 5 are layered on the first charge transport layer 3 (S3).

The first charge transport layer 3 can be formed using any of various known methods, for example, vacuum vapor deposition, sputtering, or an application method.

The intermediate layer 4 can be formed using any of various known methods, for example, an application method. The intermediate layer 4 can be formed by, for example, applying a first photosensitive resin composition in liquid form onto the entire surface and firing the applied composition. The first photosensitive resin composition may be negative-working or positive-working.

The first photosensitive resin composition contains, for example, the first resin and the first photosensitive material. Further, the first photosensitive resin composition may contain a solvent. Furthermore, the first photosensitive resin composition may further contain the functional material such as the first light-emitting material or the second charge transport material that transports a second charge.

The first resin is preferably, for example, a hydrophilic resin. Examples of the first resin include a cellulose derivative, a polyalkylene oxide, polyethylene glycol distearate, polyvinyl alcohol (PVA), polyvinyl pyrrolidone (PVP), carboxyvinyl polymer, sodium polyacrylate, carboxymethylcellulose ammonium ($NH_4$-CMC), hydroxypropyl stearyl ether, hydroxypropyl sulfonate, xanthan gums, alginates, gelatin, cyclodextrin, gum arabic, bean gum, starch, oil viscosity index improvers (macchann), gelling agents, carrageenan, locust bean gums, associative polyurethane thickeners, polymeric surfactants, and the like. The first resin preferably has an sp value of 20 or more and 30 or less.

When the first photosensitive resin composition is negative-working, the first photosensitive material is, for example, a mixture of a photopolymerization initiator corresponding to exposure light and a cross-linkable resin such as an epoxy group or a vinyl group, and the first photosensitive material cures the first photosensitive resin composition that has become the intermediate layer 4 when exposed. When the first photosensitive resin composition is positive-working, the first photosensitive material is, for example, a compound that is decomposed by exposure light to become water-soluble, and the first photosensitive material allows the first photosensitive resin composition that has become the intermediate layer 4 when exposed to be water-soluble.

That is, the first photosensitive resin composition contains an unexposed portion containing a mixture of the first resin being hydrophilic and the first photosensitive material when the first photosensitive resin composition is negative-working, and an exposed portion containing a mixture of the first resin being hydrophilic and the first photosensitive material when the first photosensitive resin composition is positive-working.

The light-emitting layer 5 can be formed using any of various known methods, for example, an application method. The light-emitting layer 5 can be formed by, for example, applying a second photosensitive resin composition in liquid form onto the entire surface and firing the applied composition. Note that the second photosensitive resin composition is negative-working when the first photosensitive resin composition is negative-working, and is positive-working when the first photosensitive resin composition is positive-working. Note that when the first photosensitive resin composition and the second photosensitive resin composition are negative-working, adhesion is improved, and thus resistance in a subsequent step is improved and film peeling due to deterioration over time in a final product can be suppressed.

The second photosensitive resin composition contains, for example, a second resin, a second photosensitive material, and the first light-emitting material. Further, the second photosensitive resin composition may contain a solvent.

The second resin is preferably, for example, a hydrophobic resin. The second resin is a resin component such as. for example, an acrylic resin, a phenolic resin such as a novolac resin, a rubber-based resin, a styrene-based resin, or an epoxy-based resin. The second resin preferably has an sp value of 0 or more and 20 or less.

Figure 2C:
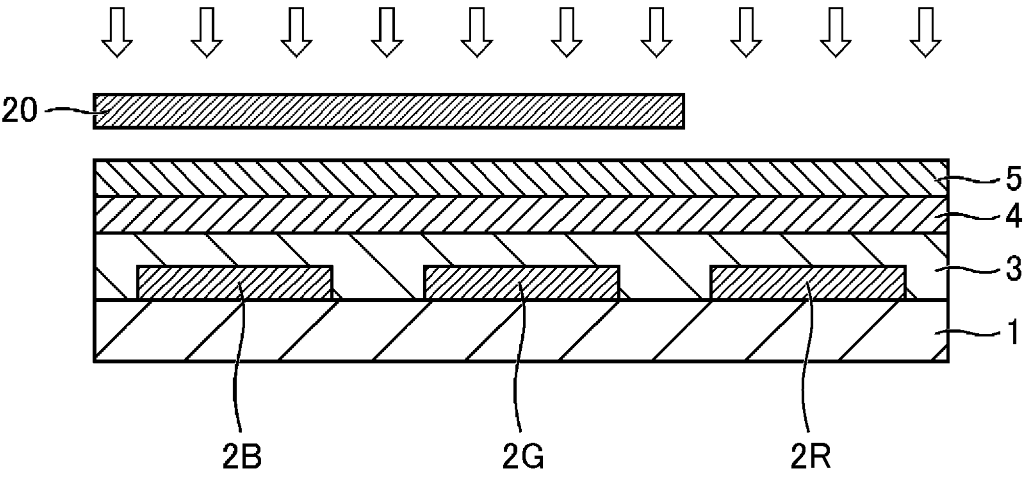
FIG. 2C is a view for describing a step in the example of the method for manufacturing the light-emitting element according to the first embodiment.

Next, the light-emitting layer 5 and the intermediate layer 4 are exposed using, for example, a mask 20 having a predetermined pattern as illustrated in FIG. 2C (S4). Here, the mask 20 has a pattern in which the region corresponding to the first light-emitting element 10R of the light-emitting layer 5 and the intermediate layer 4 remains due to subsequent development. Here, a case will be described in which the light-emitting layer 5 and the intermediate layer 4 are formed of a negative photosensitive resin composition and the pattern is such that the region corresponding to the first light-emitting element 10R is exposed. Note that, when the light-emitting layer 5 and the intermediate layer 4 are formed of a positive photosensitive resin composition, the mask 20 may have a pattern in which a region other than the region corresponding to the first light-emitting element 10R is exposed, contrary to the negative photosensitive resin composition. Note that a portion of the light-emitting layer 5 dissolved in a first developing solution after exposure is referred to as a first portion, and a portion of the intermediate layer 4 dissolve in a second developing solution after exposure is referred to as a second portion.

Figure 2D:
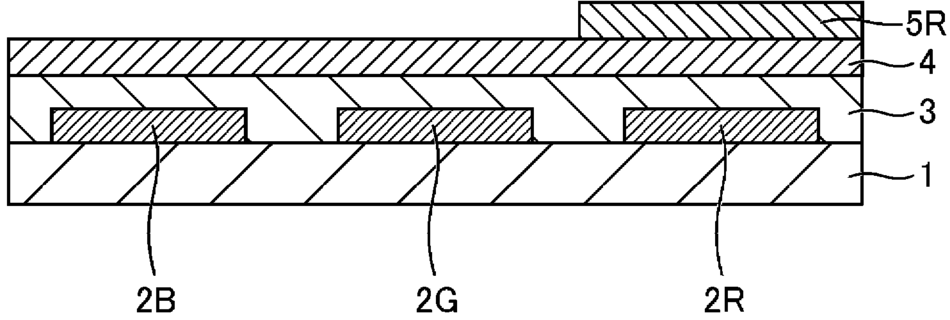
FIG. 2D is a view for describing a step in the example of the method for manufacturing the light-emitting element according to the first embodiment.

Next, as illustrated in FIG. 2D, the light-emitting layer 5 is developed with the first developing solution, that is, the first portion is dissolved in the first developing solution, and thus the light-emitting layer 5 is patterned into the first light-emitting layer 5R (S5). The first developing solution is, for example, an organic solvent-based developing solution. Examples of the organic solvent-based developing solution include propylene glycol monomethyl ether acetate (PGMEA), acetone, N-methylpyrrolidone (NMP), and dimethyl sulfoxide (DMSO). In the development with the first developing solution, the intermediate layer 4 contains the water-soluble resin as the first resin and is less likely to be developed and patterned. That is, the solubility of the second portion in the first developing solution is small. Thus, the first charge transport layer 3 below the intermediate layer 4 can be less likely to be damaged by the first developing solution. In addition, during the development, the first light-emitting material contained in the light-emitting layer 5 is protected by the intermediate layer 4 and can be prevented from coming into contact with the first charge transport layer 3 and remaining.

Figure 2E:
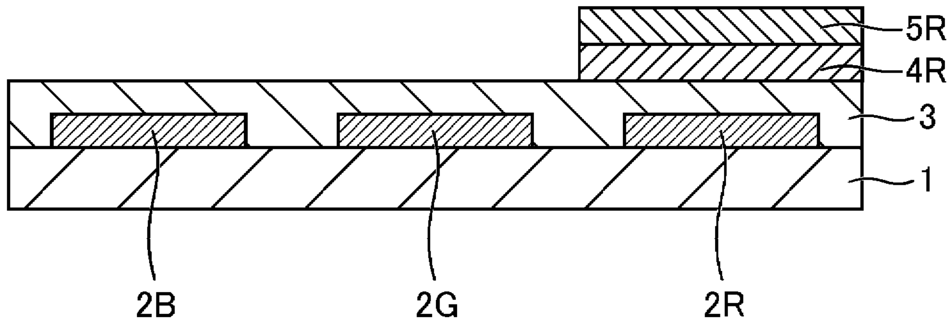
FIG. 2E is a view for describing a step in the example of the method for manufacturing the light-emitting element according to the first embodiment.

Next, as illustrated in FIG. 2E, the intermediate layer 4 is developed with the second developing solution, that is, the second portion is dissolved in the second developing solution, and thus the intermediate layer 4 is patterned into the intermediate layer 4R (S6). The second developing solution is, for example, an aqueous developing solution. Even if a residue of the first light-emitting material derived from the light-emitting layer 5 remains above the intermediate layer 4 in the development with the second developing solution, the residue can be removed by the development with the second developing solution. Thus, contamination of the first light-emitting material in the first charge transport layer 3 can be prevented.

As described above, the solubility of the first portion in the first developing solution and the solubility of the second portion in the first developing solution are different from each other. The solubility of the first portion in the first developing solution is preferably larger than the solubility of the second portion in the first developing solution.

For example, a hydrophilic resin is preferably used as the first resin and warm water of about 30° C. is preferably used as the first developing solution. Thus, the first charge transport layer 3 below the intermediate layer 4 is prevented from being exposed to the first developing solution, and the deterioration of the first charge transport layer 3 due to the first developing solution is suppressed.

Furthermore, although the light-emitting layer 5 is developed with the first developing solution and the intermediate layer 4 is developed with the second developing solution in the above description, the light-emitting layer 5 and the intermediate layer 4 may be developed with the first developing solution.

After the patterning the intermediate layer 4R and the first light-emitting layer 5R, for example, washing with water and air drying are further performed, followed by hard baking (S7).

Next, by repeating steps S3 to S7, the second light-emitting layer 5G and the intermediate layer 4G corresponding to the second light-emitting element 10G, and the third light-emitting layer 5B and the intermediate layer 4B corresponding to the third light-emitting element 10B are formed (S8). Note that when the second light-emitting layer 5G is formed, in the second photosensitive resin composition, a photosensitive composition containing the second light-emitting material may be used instead of the first light-emitting material. When the third light-emitting layer 5B is formed, in the second photosensitive resin composition, a photosensitive composition containing the third light-emitting material may be used instead of the first light-emitting material. Furthermore, the intermediate layers 4G and 4B may be the same as or different from the intermediate layer 4R as long as they are formed of the first photosensitive resin composition.

Next, the second charge transport layer 6 is formed on the first light-emitting layer 5R, the second light-emitting layer 5G, and the third light-emitting layer 5B (S9). The second charge transport layer 6 can be formed using any of various known methods, for example, vacuum vapor deposition, sputtering, or an application method. The second charge transport layer 6 may be patterned corresponding to the light-emitting element of each color.

Next, the second electrode 7 is formed on the second charge transport layer 6 (S10). The second electrode 7 can be formed using any of various known methods, for example, a sputtering method or a vacuum vapor deposition technique.

The light-emitting element 100 illustrated in FIG. 1 can be manufactured in the above-described manner.

Although the first light-emitting element 10R, the second light-emitting element 10G, and the third light-emitting element 10B are manufactured in similar steps in the above description, this does not have to be the case. For example, the light-emitting layer, the charge transport layer, and the like of one or two of the first light-emitting element 10R, the second light-emitting element 10G, and the third light-emitting element 10B may be formed in an inkjet method.

The first charge transport layer 3 may be subjected to surface treatment before the intermediate layer 4 is formed on the first charge transport layer 3. Further, the intermediate layer 4 may be subjected to surface treatment before the light-emitting layer 5 is formed on the intermediate layer 4. Examples of the surface treatment include hydrophilization treatment such as plasma treatment and hydrophobization treatment such as silylation treatment depending on the first photosensitive resin composition used for forming the intermediate layer 4 or the second photosensitive resin composition used for forming the light-emitting layer 5. Thus, the intermediate layer 4 or the light-emitting layer 5 can be formed more uniformly.

Note that in the above description, when forming the intermediate layer 4, the first photosensitive resin composition is used, but no such limitation is intended. For example, when forming the intermediate layer 4, a water-soluble resin composition that does not contain the first photosensitive material may be used. Then the intermediate layer 4 may be patterned by forming the light-emitting layer 5 on the formed intermediate layer 4 by using the second photosensitive resin composition in the same manner as described above, patterning the light-emitting layer 5, and then using the patterned light-emitting layer 5 as a protection layer to remove a region of the intermediate layer 4 where the light-emitting layer 5 is not formed with, for example, an aqueous developing solution.

The disclosure is not limited to the embodiments described above, and may be substituted with a configuration that is substantially the same as the configuration described in the embodiments described above, a configuration that achieves the same action and effect, or a configuration capable of achieving the same object.

The invention claimed is:

1. A method for manufacturing a light-emitting element, comprising:

a) forming an intermediate layer containing a first resin on a charge transport layer;

b) forming a light-emitting layer containing a second resin, a second photosensitive material, and a first luminescent material on the intermediate layer;

c) exposing the intermediate layer and the light-emitting layer in a predetermined pattern to obtain an exposed intermediate layer and an exposed light-emitting layer, respectively; and d) developing the exposed intermediate layer and the exposed light-emitting layer with a developing solution, wherein a solubility of a second portion of the exposed intermediate layer dissolved in the developing solution and a solubility of a first portion of the exposed light-emitting layer dissolved in the developing solution are different from each other.

2. The method for manufacturing a light-emitting element according to claim 1, wherein the intermediate layer further contains a first photosensitive material.

3. The method for manufacturing a light-emitting element according to claim 1, wherein the developing solution dissolves the first portion and the second portion, and the solubility of the first portion is larger than the solubility of the second portion.

4. The method for manufacturing a light-emitting element according to claim 1, wherein the developing solution includes a first developing solution configured to dissolve the first portion and a second developing solution configured to dissolve the second portion, and the first portion is dissolved in the first developing solution, and then the second portion is dissolved in the second developing solution.

5. The method for manufacturing a light-emitting element according to claim 1, wherein the first resin is a water-soluble resin.

6. The method for manufacturing a light-emitting element according to claim 5, wherein the water-soluble resin has an sp value of 20 or more and 30 or less.

7. The method for manufacturing a light-emitting element according to claim 1, wherein the second resin is a hydrophobic resin.

8. The method for manufacturing a light-emitting element according to claim 7, wherein the hydrophobic resin has an sp value of 0 or more and 20 or less.

9. The method for manufacturing a light-emitting element according to claim 1, wherein the intermediate layer is formed in direct contact with the charge transport layer and the light-emitting layer.

10. The method for manufacturing a light-emitting element according to claim 1, wherein the intermediate layer further contains a functional material.

11. A method for manufacturing a light-emitting element, comprising:

a) forming an intermediate layer containing a water-soluble resin on a charge transport layer;

b) forming a light-emitting layer containing a hydrophobic resin, a second photosensitive material, and a first luminescent material on the intermediate layer;

c) exposing the intermediate layer and the light-emitting layer in a predetermined pattern to obtain an exposed intermediate layer and an exposed light-emitting layer; and d) developing the exposed intermediate layer and the exposed light-emitting layer with a developing solution.

12. The method for manufacturing a light-emitting element according to claim 11, wherein the intermediate layer further contains a first photosensitive material.

13. The method for manufacturing a light-emitting element according to claim 11, wherein a solubility of a second portion of the exposed intermediate layer dissolved in the developing solution and a solubility of a first portion of the exposed light-emitting layer dissolved in the developing solution are different from each other.

14. The method for manufacturing a light-emitting element according to claim 13, wherein the developing solution dissolves the first portion and the second portion, and the solubility of the first portion is larger than the solubility of the second portion.

15. The method for manufacturing a light-emitting element according to claim 13, wherein the developing solution includes a first developing solution configured to dissolve the first portion and a second developing solution configured to dissolve the second portion, and the first portion is dissolved in the first developing solution, and then the second portion is dissolved in the second developing solution.

16. The method for manufacturing a light-emitting element according to claim 11, wherein the water-soluble resin has an sp value from 20 to 30.

17. The method for manufacturing a light-emitting element according to claim 11, wherein the hydrophobic resin has an sp value of 0 or more and 20 or less.

18. The method for manufacturing a light-emitting element according to claim 11, wherein the intermediate layer is formed in direct contact with the charge transport layer and the light-emitting layer.

19. The method for manufacturing a light-emitting element according to claim 11, wherein the intermediate layer further contains a functional material.

20. A light-emitting element comprising:

a charge transport layer;

an intermediate layer provided on the charge transport layer and containing a first photosensitive material or a modified product of the first photosensitive material; and a light-emitting layer provided on the intermediate layer and containing a second photosensitive material or a modified product of the second photosensitive material and a first luminescent material, wherein the intermediate layer contains a functional material, wherein the functional material is a second luminescent material, and a weight ratio of the second luminescent material in the intermediate layer is smaller than a weight ratio of the first luminescent material in the light-emitting layer.

* * * * *